United States Patent
Hsieh et al.

(10) Patent No.: US 8,975,971 B2
(45) Date of Patent: Mar. 10, 2015

(54) DIGITALLY CONTROLLED OSCILLATOR

(75) Inventors: Hong-Yean Hsieh, Santa Clara, CA (US); Chao-Cheng Lee, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 837 days.

(21) Appl. No.: 12/831,255

(22) Filed: Jul. 7, 2010

(65) Prior Publication Data
US 2011/0012657 A1    Jan. 20, 2011

Related U.S. Application Data

(60) Provisional application No. 61/226,648, filed on Jul. 17, 2009.

(51) Int. Cl.
*H03L 7/099* (2006.01)
*H03J 1/00* (2006.01)

(52) U.S. Cl.
CPC . H03J 1/00 (2013.01); H03L 7/099 (2013.01); H03J 2200/10 (2013.01)
USPC .................................... 331/36 C; 331/177 V

(58) Field of Classification Search
USPC ............................ 331/16, 36 C, 177 R, 177 V
See application file for complete search history.

(56) References Cited

U.S. PATENT DOCUMENTS

| 6,734,741 B2 | 5/2004 | Staszewski et al. |
| 6,870,434 B2 | 3/2005 | Han et al. |
| 8,000,428 B2 * | 8/2011 | Staszewski et al. ........... 375/362 |

FOREIGN PATENT DOCUMENTS

CN    1832333    9/2006

OTHER PUBLICATIONS

English Abstract for CN 1832333 (Sep. 13, 2006).
Staszewski, et al.: Digitally Controlled Oscillator (DCO)-Based Architecture for RF Frequency Synthesis in a Deep-Submicrometer CMOS Process; IEEE Transactions on Circuits and Systems—II: Analog and Digital Signal Processing, vol. 50, No. 11, Nov. 2003; pp. 815-828.
Wang, et al.: "A 3.8GHz Fully Integrated Digitally-Controlled LC Oscillator for PHS Transceiver"; 0-7803-9584-0/06/$20.00 copyright 2006 IEEE; pp. 2263-2267.

* cited by examiner

*Primary Examiner* — Joseph Chang
(74) *Attorney, Agent, or Firm* — McClure, Qualey & Rodack, LLP

(57) ABSTRACT

A digitally controlled LC-tank oscillator is constructed by connecting different tuning circuits to a LC tank. The tuning circuit includes a single bank of tuning cells, a dual bank of tuning cells, or a fractional tuning circuit. Each of said tuning cells in the tuning circuit includes a tuning circuit element and a memory cell.

19 Claims, 10 Drawing Sheets

| $HW_3 = 0$ | $LW_3 = 0$ | $B_3 = 1$ |
| --- | --- | --- |
| $HW_2 = 0$ | $LW_2 = 1$ | $B_2 = 1$ |
| $HW_1 = 1$ | $LW_1 = 0$ | $B_1 = 0$ |
| $HW_0 = 0$ | $LW_0 = 0$ | $B_0 = 1$ |

*FIG. 5(c)*

| QIN | QRV |
|---|---|
| [-0.125, 0.125) | 0/4 |
| [0.125, 0.375) | 1/4 |
| [0.375, 0.625) | 2/4 |
| [0.625, 0.875) | 3/4 |
| [0.875, 1.125) | 4/4 |

DIGITALLY CONTROLLED OSCILLATOR

BACKGROUND OF THE INVENTION

1. Field of the Invention

The present invention relates generally to electrical circuits, and more particularly but not exclusively to circuit elements for digitally controlled oscillator fabricated as part of monolithic integrated circuits.

2. Description of the Background Art

In a digitally controlled oscillator, the operating frequency is adjusted by enabling or disabling a number of tuning circuit elements. The tuning circuit elements can be any components and circuits, such as transistors or varactors. In order to provide finer tuning resolutions and wider tuning ranges, a large number of tuning circuit elements are needed for adjusting frequencies.

The finer the resolution of the tuning circuit element is, the more the tuning circuit elements are needed in order to cover the same tuning ranges under voltage and temperature variations. To reduce area cost, an efficient access and storage scheme based on an array of memory cells are needed.

SUMMARY

Especially, the proposed dual bank structure allows simultaneous access of the tuning circuit elements that are located in different banks. Also, a fractional waveform generator uses a high-speed clock to generate a signal to enable or disable tuning circuit elements. The tuning resolution can be further reduced.

The present invention pertains to connect different tuning circuits to a LC tank. In one embodiment, a digitally controlled LC-tank oscillator is constructed by connecting different tuning circuits to a LC tank. The tuning circuit may include a single bank of tuning cells, a dual bank of tuning cells, or a fractional tuning circuit. Each of said tuning cells in the tuning circuit includes a tuning circuit element and a memory cell.

In one embodiment, the single bank of tuning cells is controlled by a single bank controller, the dual bank of tuning cells is controlled by a dual bank controller, and the fractional tuning circuit is controlled by a fractional waveform generator. According to a digital integer input, the single and dual bank controllers generate respective word lines and bit lines to adjust the capacitance value in the single bank and dual bank of tuning cells, respectively. According to a digital fractional input, the fractional waveform generator uses a high-speed clock to adjust the capacitance value in the fractional tuning circuit.

In one embodiment, a tuning circuit element determines a first capacitance value when it is enabled and a second capacitance value when it is disabled. The tuning circuit element is enabled when its associated control input signal is a binary one and disabled when its associated control input signal is a binary zero. In one embodiment, the tuning circuit element is controlled by a logical control signal from an associated memory cell. In another embodiment, the fractional waveform generator generates the fractional control signal to directly enable and disable the tuning circuit element. Dependent on the numbers of enabled and disabled tuning circuit elements in each tuning circuit, a capacitance value is determined for each tuning circuit accordingly.

In one embodiment, the single bank of tuning cells comprises a two-dimensional array of tuning cells laid out in a matrix configuration. The matrix comprises a first dimension (e.g. row) of size M and a second dimension (e.g. column) of size N. The single bank of tuning cells is configured to receive M word lines, N bit lines, and N complementary bit lines and to generate a capacitance value of $C_1$ across its two output nodes. Depending on its index within the matrix, each tuning cell is controlled by a respective word line, a respective bit line, and a respective complementary bit line. A logical value of the respective bit line is written into the tuning cell when the respective word line is asserted. If a binary one is written into the tuning cell, the tuning circuit element in the tuning cell is enabled. If a binary zero is written into the tuning cell, the tuning circuit element in the tuning cell is disabled. The capacitance of the tuning cell is decided by the logical value written to the tuning cell. The capacitance value of $C_1$ generated by the single bank of tuning cells depends on the number of enabled and disabled tuning circuit elements and the first and second capacitance values of each tuning circuit element.

In one embodiment, the dual bank of tuning cells comprises a two-dimensional array of tuning cells laid out in a matrix configuration, where M×N tuning cells are arranged in M rows and N columns. The dual bank of tuning cells includes two banks: a low bank and a high bank. The tuning cells in the first N1 columns are in the low bank whereas the tuning cells in the remaining (N−N1) columns are in the high bank. In one embodiment, N1 is equal to N/2. The tuning cells in the low and high banks are controlled by different group of word lines. The dual bank of tuning cells is configured to receive M high bank word lines, M low bank word lines, N bit lines, and N complementary bit lines and to generate a capacitance value of $C_2$. The tuning cells are located in either the low or high banks. Depending on its index within the matrix, each tuning cell in the high bank is controlled by a respective high bank word line, a respective bit line, and a respective complementary bit line. Depending on its index within the matrix, each tuning cell in the low bank is controlled by a respective low bank word line, a respective bit line, and a respective complementary bit line. The enabled and disabled tuning circuit elements in the dual bank of tuning cells determine the capacitance value of $C_2$.

The difference of the first and second capacitance values of the tuning circuit element fundamentally determines the resolution of the digitally controlled LC-tank oscillator. By using the high-speed clock to enable or disable the tuning circuit elements in the fractional tuning circuit, the tuning resolution can be further reduced. In one embodiment, the fractional tuning circuit is configured to receive the fractional control signal from the fractional waveform generator to enable or disable the tuning circuit element and to generate a capacitance value of $C_3$. The instant capacitance value of $C_3$ is dependent on if the tuning circuit element in the fractional tuning circuit is enabled or not. The long-run average of the instant capacitance value of $C_3$ gives a capacitance value between the first and second capacitance values of the tuning circuit element. In one embodiment, the fractional waveform generator is configured to receive the digital fractional input value and the high-speed clock and to generate the fractional control signal to enable or disable the tuning circuit element in the fractional tuning circuit.

The frequency of the digitally controlled oscillator is then determined by the sum of these capacitance values (e.g. $C_1+C_2+C_3$) of all the tuning circuits connected to the LC tank.

These and other features of the present invention will be readily apparent to persons of ordinary skill in the art upon reading the entirety of this disclosure, which includes the accompanying drawings and claims.

DESCRIPTION OF THE DRAWINGS

FIG. 5(c) shows the required logic values of word lines and bit lines to update the content of the memory cells from FIG. 5(a) to FIG. 5(b).

The use of the same reference label in different drawings indicates the same or like components.

DETAILED DESCRIPTION

In the present disclosure, numerous specific details are provided, such as examples of electrical circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
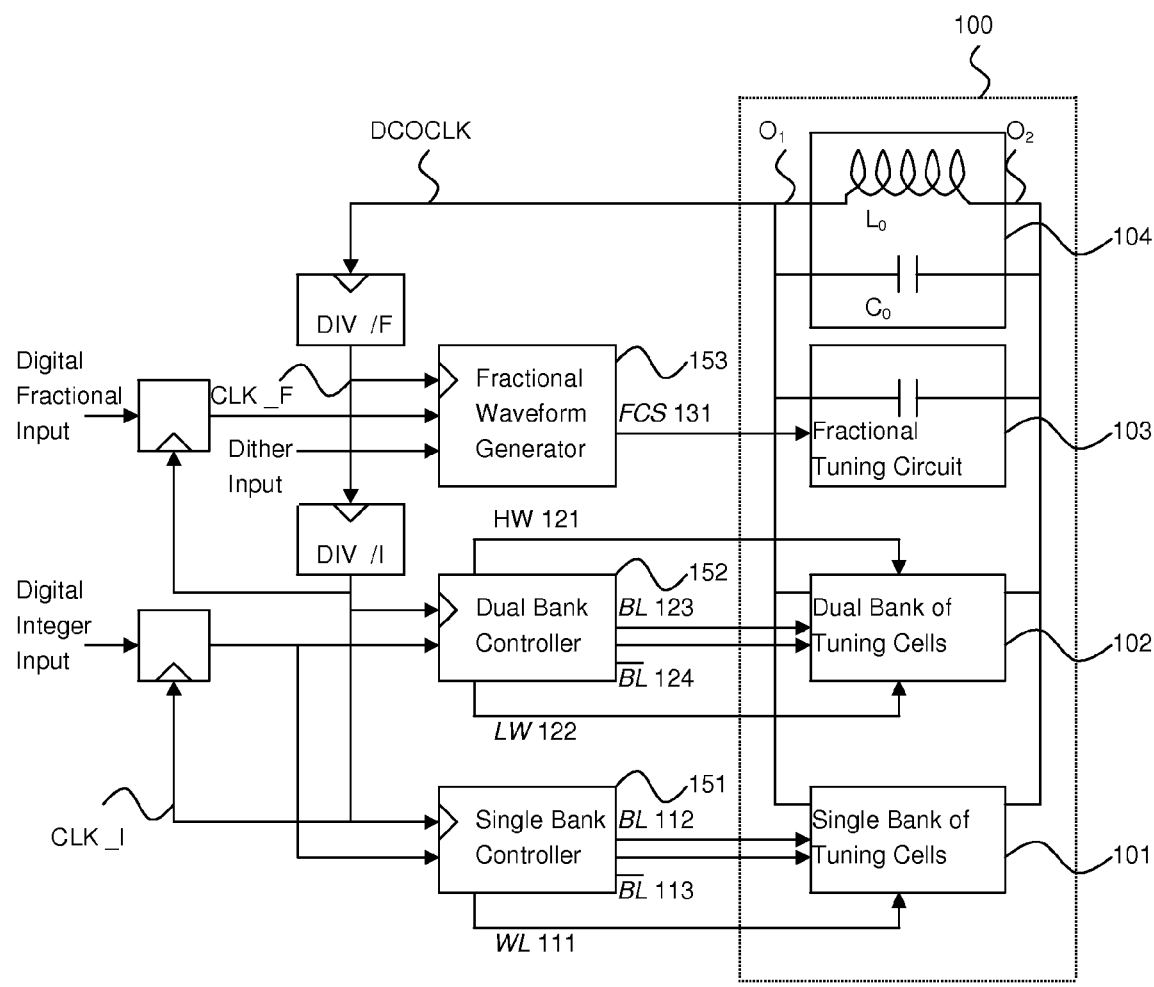
FIG. 1 shows a digitally controlled LC-tank oscillator and its control logic circuits in accordance with an embodiment of the present invention.

Embodiments of the present invention advantageously allow for fabrication of tuning circuits in a digitally controlled LC-tank oscillator. FIG. 1 shows a digitally controlled LC-tank oscillator 100 and its control logic circuits in accordance with an embodiment of the present invention. The digitally controlled LC-tank oscillator 100 is fabricated with a LC-tank 104 and one or more tuning circuits. The LC-tank 104 comprises a connection of an inductance with an inductance value of $L_0$ and a capacitor with a capacitance value of $C_0$. In an embodiment, the tuning circuits may include an integer tuning circuit and a fractional tuning circuit 103. the integer tuning circuit may include a single bank of tuning cells 101, a dual bank of tuning cells 102. Each tuning circuit determines a capacitance value. The oscillating frequency of the output clock DCOCLK is determined by the inductance value of $L_0$, the capacitance value of $C_0$ and the capacitance value of the tuning circuit. The control logic circuits generate control signals to adjust the capacitance value in each tuning circuit in accordance with a digital input. A digital input, comprising an integer part and a fractional part, represents a digitally represented oscillating frequency.

The single bank of tuning cells 101 is configured to receive a plurality of word lines 111, a plurality of bit lines 112, and a plurality of complementary bit lines 113 from a single bank controller 151 and to generate a capacitance value of $C_1$. The single bank of tuning cells 101 comprises a plurality of tuning cells. The dual bank of tuning cells 102 is configured to receive a plurality of high bank word lines 121, a plurality of low bank word lines 122, a plurality of bit lines 123, and a plurality of complementary bit lines 124 from a dual bank controller 152 and to generate a capacitance value of $C_2$. The dual bank of tuning cells 102 includes a plurality of tuning cells, where each of them is located in either high bank or low bank. The fractional tuning circuit 103 is configured to receive the fractional control signal (FCS) 135 from a fractional waveform generator 153 to generate a capacitance value of $C_3$. The frequency of the digitally controlled LC-tank oscillator 100 is then determined by the sum of the capacitance values of all the tuning circuits connected to the LC tank and the capacitance value in the LC tank. The exact formula of the oscillating frequency is $$\frac{1}{(2\pi\sqrt{L_0(C_0 + C_1 + C_2 + C_3)}}.$$

In one embodiment, the single bank controller 151 is configured to receive the digital integer input and a low-speed clock CLK_I and to generate the word lines 111, the bit lines 112, and the complementary bit lines 113 to the single bank of tuning cells 101. The low-speed clock CLK_I is obtained from dividing the output clock DCOCLK by the sum of an integer F and an integer I. The single bank controller 151 writes new data into the tuning cell in the single bank of tuning cells 101 by asserting the word lines 111. Only one word line will be asserted at a time. When a word line is asserted, the binary logic value in the bit lines 112 is written into a respective tuning cell connected to the asserted word line.

In one embodiment, the dual bank controller 152 is configured to receive the digital integer input and the low-speed clock CLK_I and to generate the high bank word lines 121, the low bank word lines 122, the bit lines 123, and the complementary bit lines 124 to the dual bank of tuning cells 102. The dual bank controller 152 writes new data into the tuning cell in the high bank and the low bank by asserting the high bank word lines 121 and the low bank word lines 122, respectively. Only one word line from each bank will be asserted at a time. When a high bank word line is asserted, the binary logic value in the bit line 123 is written into a respective tuning cell connected to the asserted high bank word line. When a low bank word line is asserted, the binary logic value 123 is written into a respective tuning cell connected to the asserted low bank word line.

In one embodiment, the fractional waveform generator 153 is configured to receive the digital fractional input and a high-speed clock CLK_F and to generate the fractional control signal (FCS) 135 to enable or disable the tuning circuit element in the fractional tuning circuit 103. The high-speed clock CLK_F is obtained from dividing the output clock DCOCLK by an integer of F.

Figure 2:
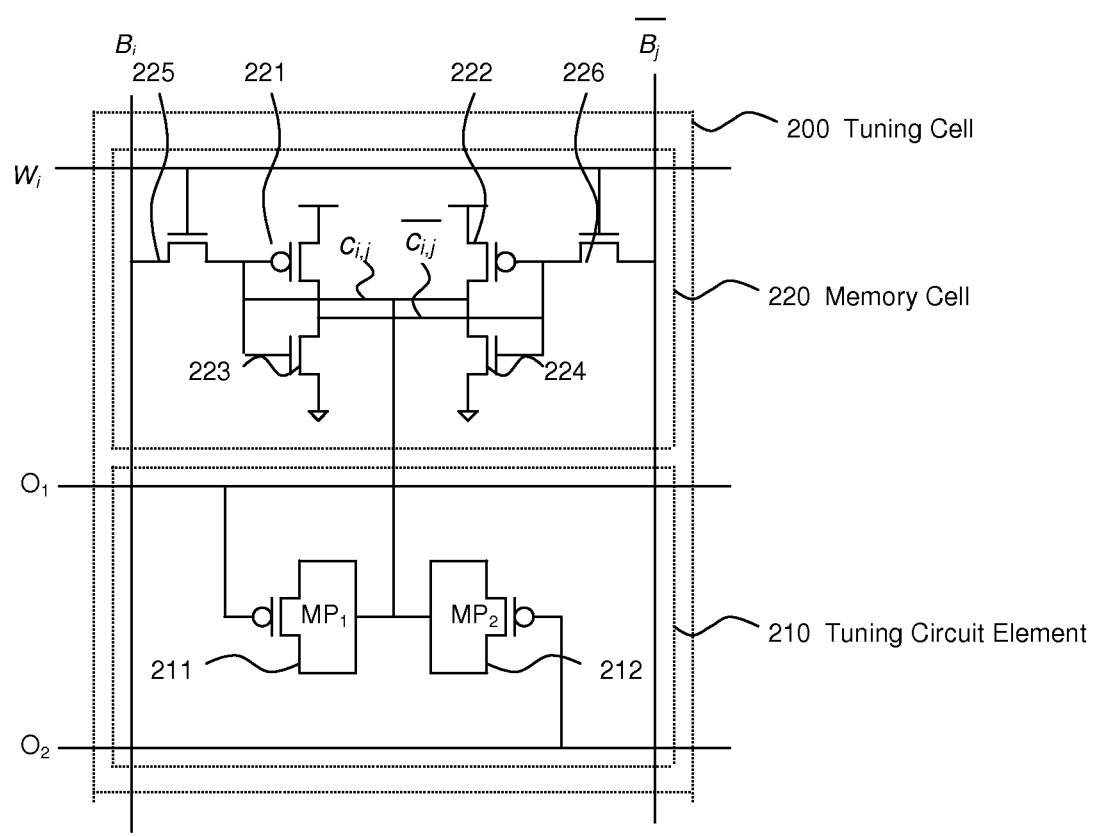
FIG. 2 schematically shows a tuning cell that includes a memory cell and a tuning circuit element in accordance with an embodiment of the present invention.

In one embodiment, FIG. 2 schematically shows a tuning cell 200 in accordance with an embodiment of the present invention. The tuning cell 200 comprises a tuning circuit element 210 and a memory cell 220. The tuning cell 200 is configured to receive a word line $W_i$, a bit line $B_j$, and a complementary bit line $\overline{B_j}$ and to generate a capacitance value across its output nodes $O_1$ and $O_2$. The tuning circuit element 210 can be any components and circuits, such as transistors or varactors. The memory cell 220 can be any storage device with compact layout.

In one embodiment, the tuning circuit element 210 comprises a pair of PMOS (p-type metal-oxide-semiconductor) transistors 211 and 212. The tuning circuit element 210 is configured to receive a digital control signal $C_{i,j}$ from the memory cell 220. When the digital control signal $C_{i,j}$ is a binary one, the tuning circuit element is enabled and a first capacitance value is generated across its two output nodes $O_1$ and $O_2$. When the digital control signal $C_{i,j}$ is a binary zero, the tuning circuit element is disabled and a second capacitance value is generated across its two output nodes $O_1$ and $O_2$.

In one embodiment, the memory cell 220 is a static random access memory with one read/write port. The two cross-connected inverters 221, 222, 223, and 224 in the memory cell 220 store the data. The memory cell 220 is configured to generate the digital control input signal $C_{i,j}$ of the tuning circuit element 210. In other words, the logic value of the stored data in the memory cell 220 determines the capacitance value across the output nodes $O_1$ and $O_2$ of the tuning circuit element 210. If the logic value of the stored data is a binary one, the tuning circuit element 210 is enabled and the first capacitance value is generated across the output nodes $O_1$ and $O_2$. If the logic value of the stored data is a binary zero, the tuning circuit element 210 is disabled and the second capacitance value is generated across the output nodes $O_1$ and $O_2$.

A new logic value can be written into the memory cell 220 through transistors 225 and 226. The transistors 225 and 226 are two NMOS (n-type metal-oxide-semiconductor) transistors. If the word line $W_i$ is a binary one, the logic value in the bit line $B_j$ is written into the memory cell to replace its original stored data. If the word line is a binary zero, the logic value of the stored data in the memory cell is held.

In one embodiment, if a binary one is written into the memory cell 220, the complementary logic values in the bit line and complementary bit line, $B_j$ and $\overline{B_j}$, are set to a binary one and a binary zero, respectively, with the word line asserted, (e.g., binary one). If a binary zero is written into the memory cell 220, the complementary logic values in the bit line and complementary bit line, $B_j$ and $\overline{B_j}$, are set to a binary zero and a binary one, respectively, with the word line asserted, (e.g., binary one).

Figure 3:
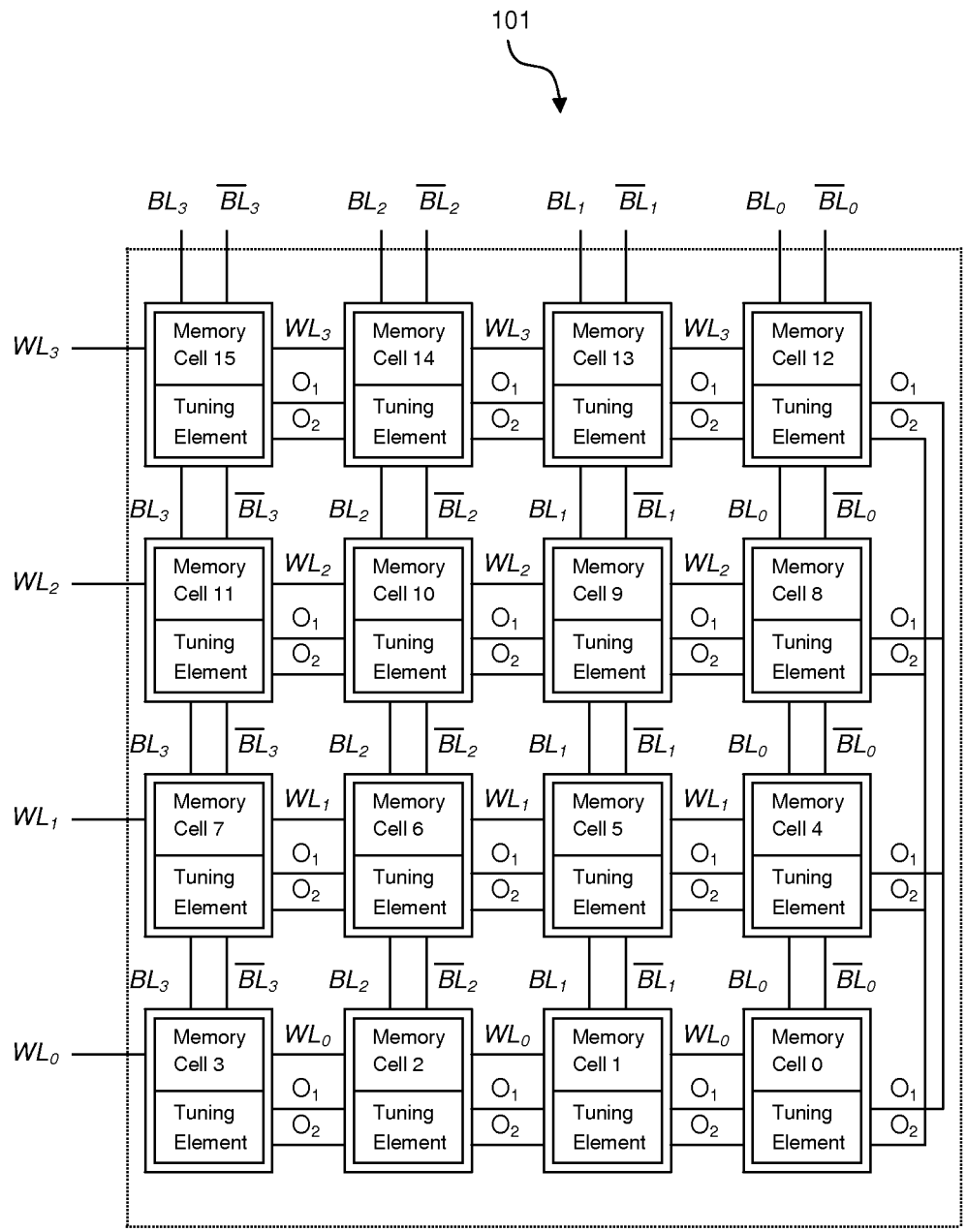
FIG. 3 schematically shows a single bank of tuning cells in accordance with an embodiment of the present invention.

The single bank of tuning cells 101 comprises a two-dimensional array of tuning cells laid out in a matrix configuration, where M×N tuning cells are arranged in M rows and N columns. In one embodiment, FIG. 3 schematically shows the single bank of tuning cells 101 in accordance with an embodiment of the present invention where M=4 and N=4. The single bank of tuning cells 101 is configured to receive 4 word lines ($WL_0$, $WL_1$, $WL_2$, and $WL_3$), 4 bit lines ($B_0$, $B_1$, $B_2$, and $B_3$), and 4 complementary bit lines ($\overline{B_0}$, $\overline{B_1}$, $\overline{B_2}$, and $\overline{B_3}$) and to generate the capacitance value of $C_1$ across its two output nodes $O_1$ and $O_2$. The single bank of tuning cells 101 comprises a total of 16 tuning cells. There are a total of four rows and four tuning cells are arranged in each row. Depending on its index within the matrix, each tuning cell is controlled by the respective word line and respective bit lines.

The outputs nodes $O_1$ of all the tuning cells in the single bank of tuning cells are connected together and so are the output nodes $O_2$. Therefore, the capacitance value of $C_1$ across the output nodes $O_1$ and $O_2$ of the single bank of tuning cells 101 is the sum of the capacitance values of all the tuning cells, which depends on logic value of the stored data in the associated memory cell and the first and second capacitance values of each tuning circuit element. Each tuning cell generates a capacitance value dependent on the logic value of the stored data in its associated memory cell. For example, when the logic value of the stored data in the memory cell is a binary one, the first capacitance value of the tuning cell is generated. When the logic value of the stored data in the memory cell is a binary zero, the second capacitance value of the tuning cell is generated.

The dual bank of tuning cells 102 comprises a two-dimensional array of tuning cells laid out in a matrix configuration, where M×N tuning cells are arranged in M rows and N columns. The dual bank of tuning cells includes two banks: a low bank and a high bank. The tuning cells in the first N1 columns are located in the low bank whereas the tuning cells in the remaining (N−N1) columns are located in the high bank. In one embodiment, N1 is equal to N/2. The tuning cells in the low and high banks are controlled by different group of word lines.

Figure 4:
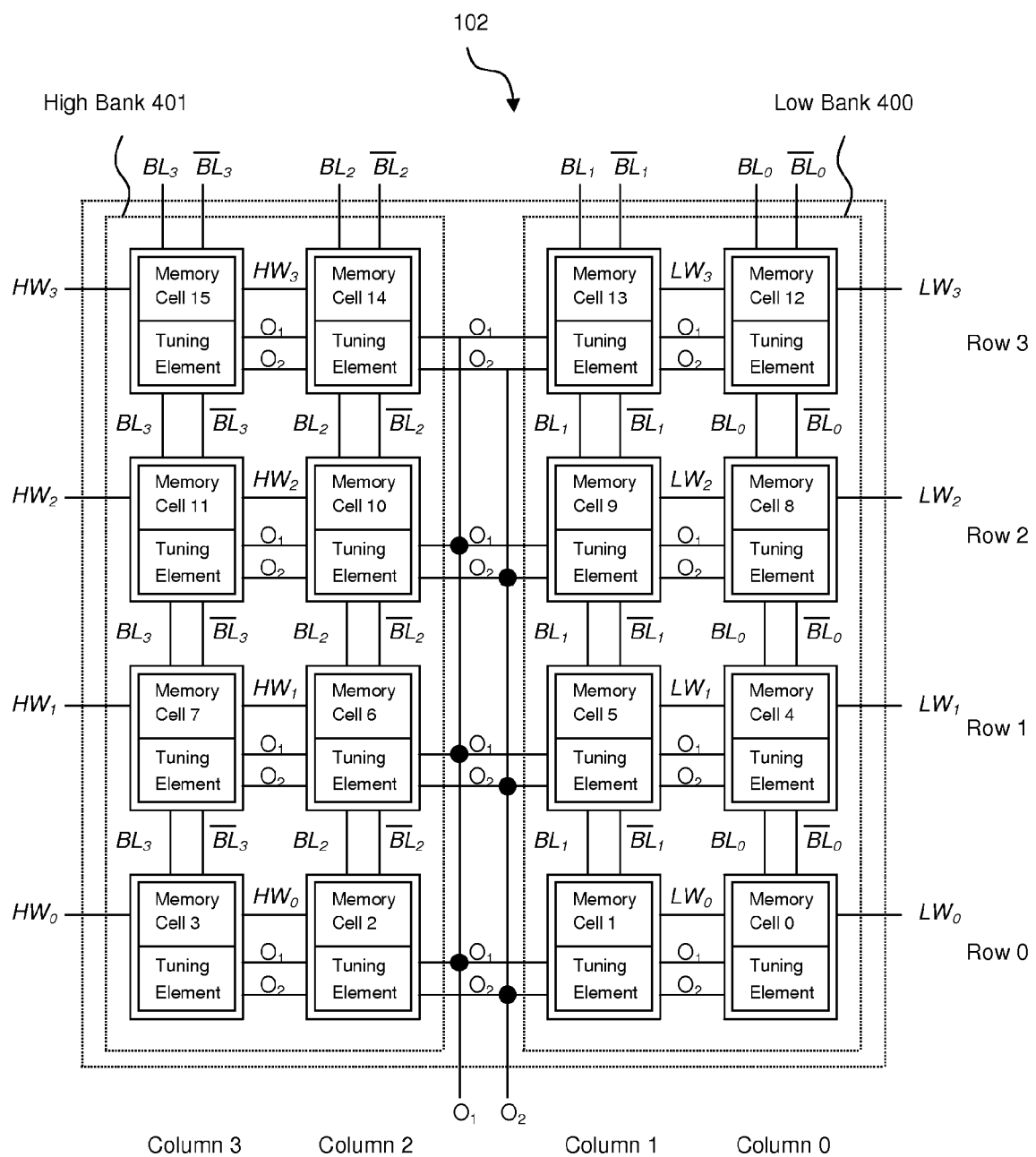
FIG. 4 schematically shows a dual bank of tuning cells in accordance with an embodiment of the present invention.

In one embodiment, FIG. 4 schematically shows the dual bank of tuning cells 102 in accordance with an embodiment of the present invention where M=4 and N=4. The tuning cells in the column 0 and 1 are located in the low bank 400 whereas the tuning cells in the column 2 and 3 are located in the high bank 401. The dual bank of tuning cells 102 is configured to receive 4 high bank word lines ($HW_0$, $HW_1$, $HW_2$, and $HW_3$), 4 low bank word lines ($LW_0$, $LW_1$, $LW_2$, and $LW_3$), 4 bit lines ($B_0$, $B_1$, $B_2$, and $B_3$), and 4 complementary bit lines ($\overline{B_0}$, $\overline{B_1}$, $\overline{B_2}$, and $\overline{B_3}$) and to generate the capacitance value of $C_2$ across its two output nodes $O_1$ and $O_2$. The dual bank of tuning cells 102 comprises a total of 16 tuning cells. There are a total of four rows and four tuning cells are arranged in each row. Depending on its index within the matrix, each tuning cell is controlled by the respective word line and respective bit lines. The low bank word lines control the tuning cells in the low bank 400 whereas the high bank word lines control the tuning cells in the high bank 401.

The outputs nodes $O_1$ of all the tuning cells in the dual bank of tuning cells are connected together and so are the output nodes $O_2$. Therefore, the capacitance value of $C_2$ across the output nodes $O_1$ and $O_2$ of the dual bank of tuning cells 102 is the sum of the capacitance values of all the tuning cells, which depends on logic value of the stored data in the associated memory cell and the first and second capacitance values of each tuning circuit element. Each tuning cell generates a capacitance value dependent on the logic value of the stored data in its associated memory cell. For example, when the logic value of the stored data in the memory cell is a binary one, the first capacitance value of the tuning cell is generated. When the logic value of the stored data in the memory cell is a binary zero, the second capacitance value of the tuning cell is generated.

Figure 5A:
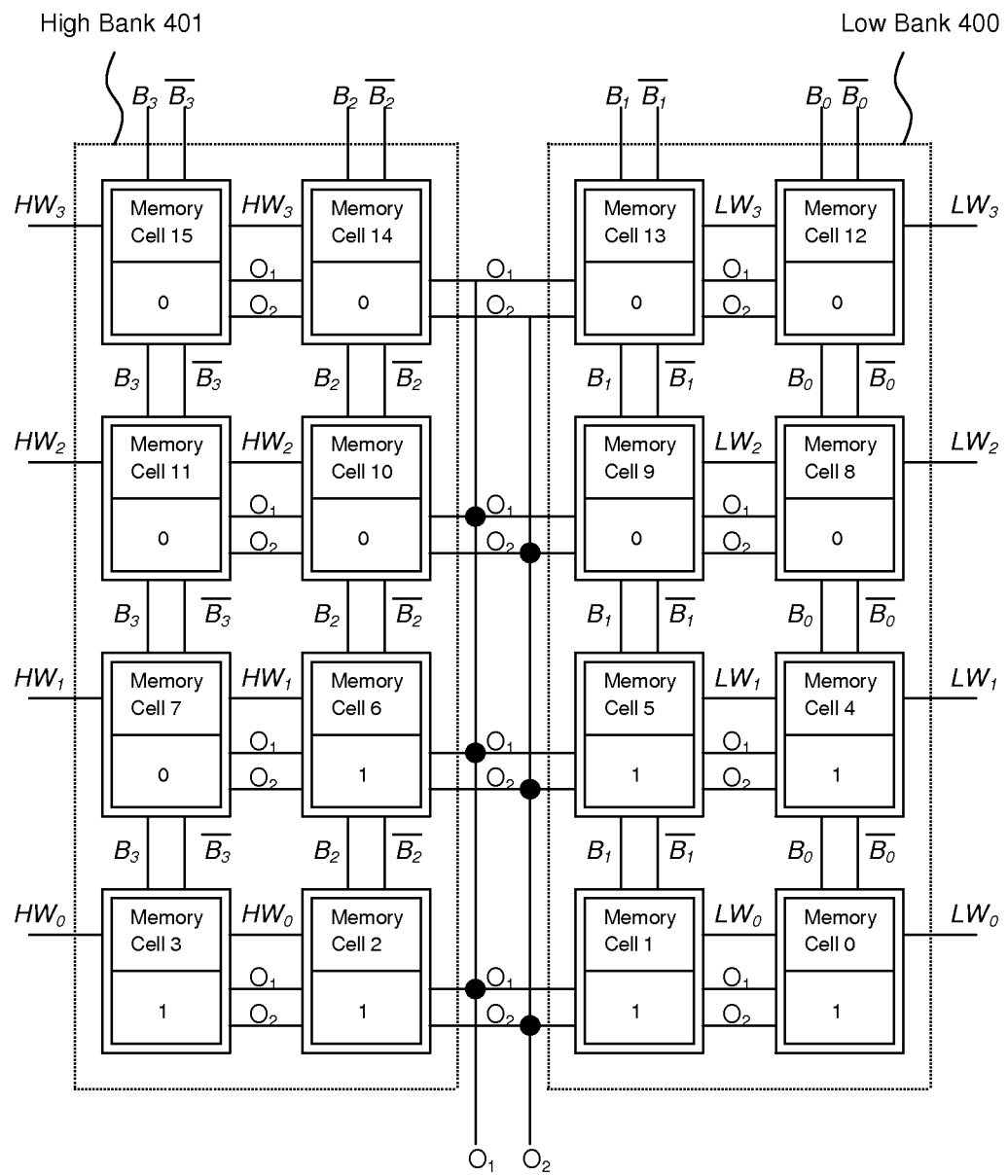
FIG. 5(a) shows logic values in the memory cells at one instant in the dual bank of tuning cells in FIG. 4.
Figure 5B:
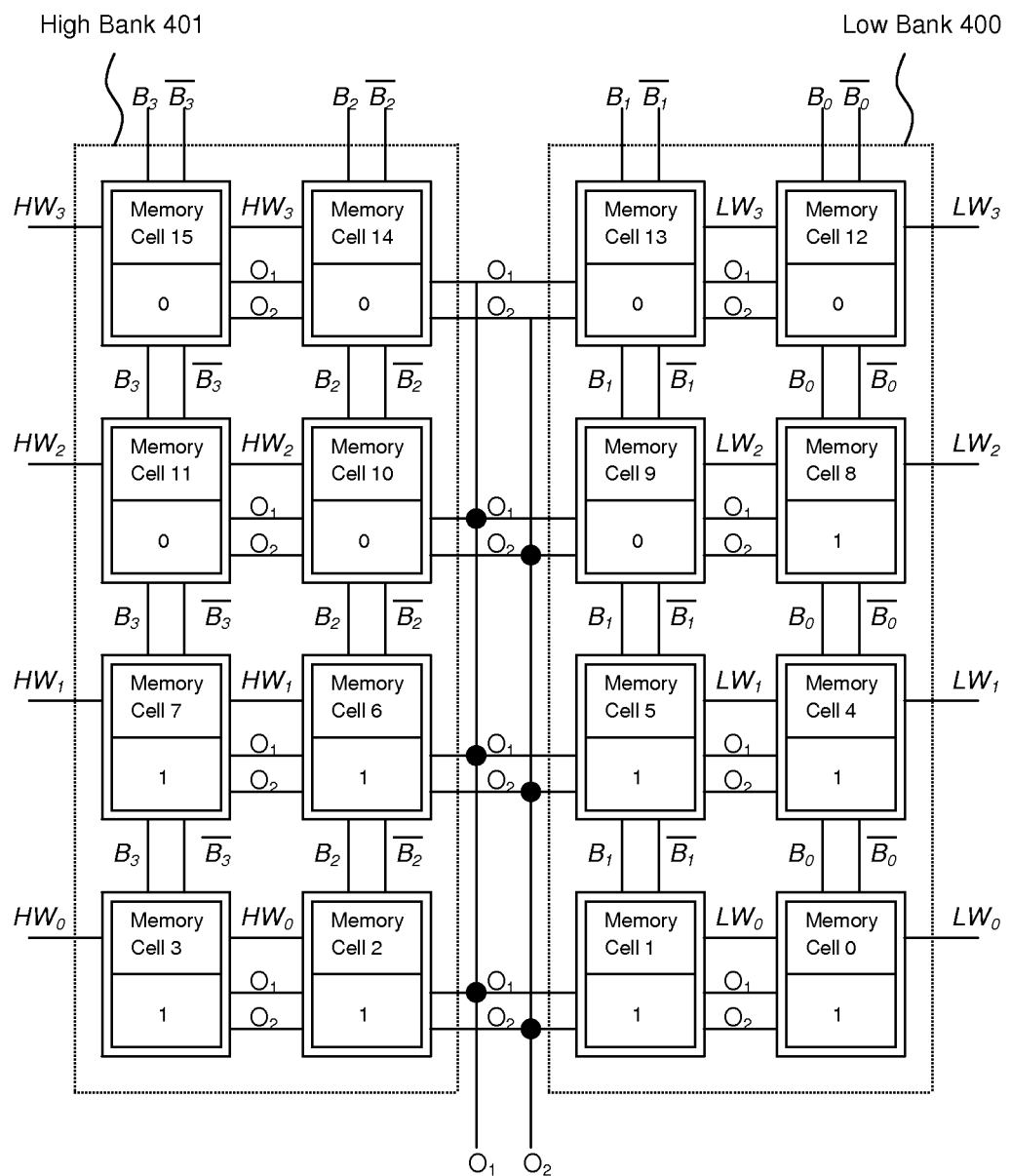
FIG. 5(b) shows logic values in the memory cells at another instant in the dual bank of tuning cells in FIG. 4.

The tuning cells in the high and low banks can be accessed independently by asserting the high and low bank word lines, respectively. Therefore the accessed tuning cells in the high and low banks can be not in the same row. FIG. 5(a) shows stored binary data in the associated memory cells at one instant in the dual bank of tuning cells 102. In this embodiment, the stored binary data of the associated memory cells in all the columns of the row 0 and in the column 0, 1, and 2 of the row 1 are one. The stored binary data in the other associated memory cells are zero. To write a binary one to the tuning cells in the column 3 of the row 1 and in the column 0 of the row 2 as shown in FIG. 5(b), high bank word line $HW_1$ and low bank word line $LW_2$ have to be asserted, i.e., set to binary one. The required settings of the word lines and bit lines are shown in FIG. 5(c).

Figure 6:
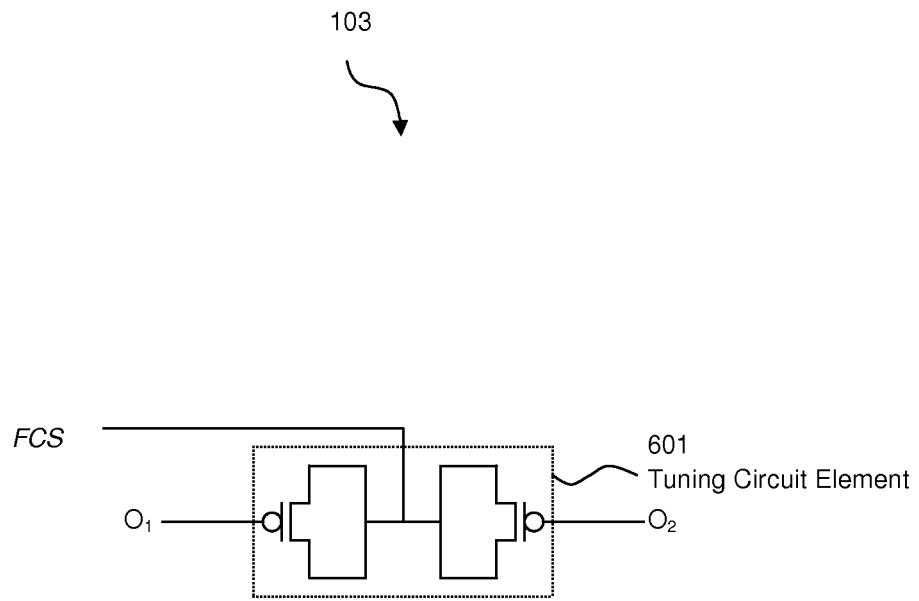
FIG. 6 schematically shows a fractional tuning circuit element in accordance with an embodiment of the present invention.

In one embodiment, FIG. 6 schematically shows the fractional tuning circuit 103 in accordance with an embodiment of the present invention. The fractional tuning circuit 103 is configured to receive the fractional control signal (FCS) from the fractional waveform generator 153 and to generate a capacitance value of $C_3$ across its two output nodes. The tuning circuit element 601 in the fractional tuning circuit generates a first capacitance value when its control input signal is a binary one and a second capacitance value when its control input signal is a binary zero. To display a average capacitance value between its first and second capacitance values, the tuning circuit element 601 is enabled and disabled by the fractional control signal (FCS) which is clocked out by the high-speed clock CLK_F. In doing so, the long-run average capacitance value of the fractional tuning circuit can achieve a capacitance value between the first and second capacitance values.

Figure 7:
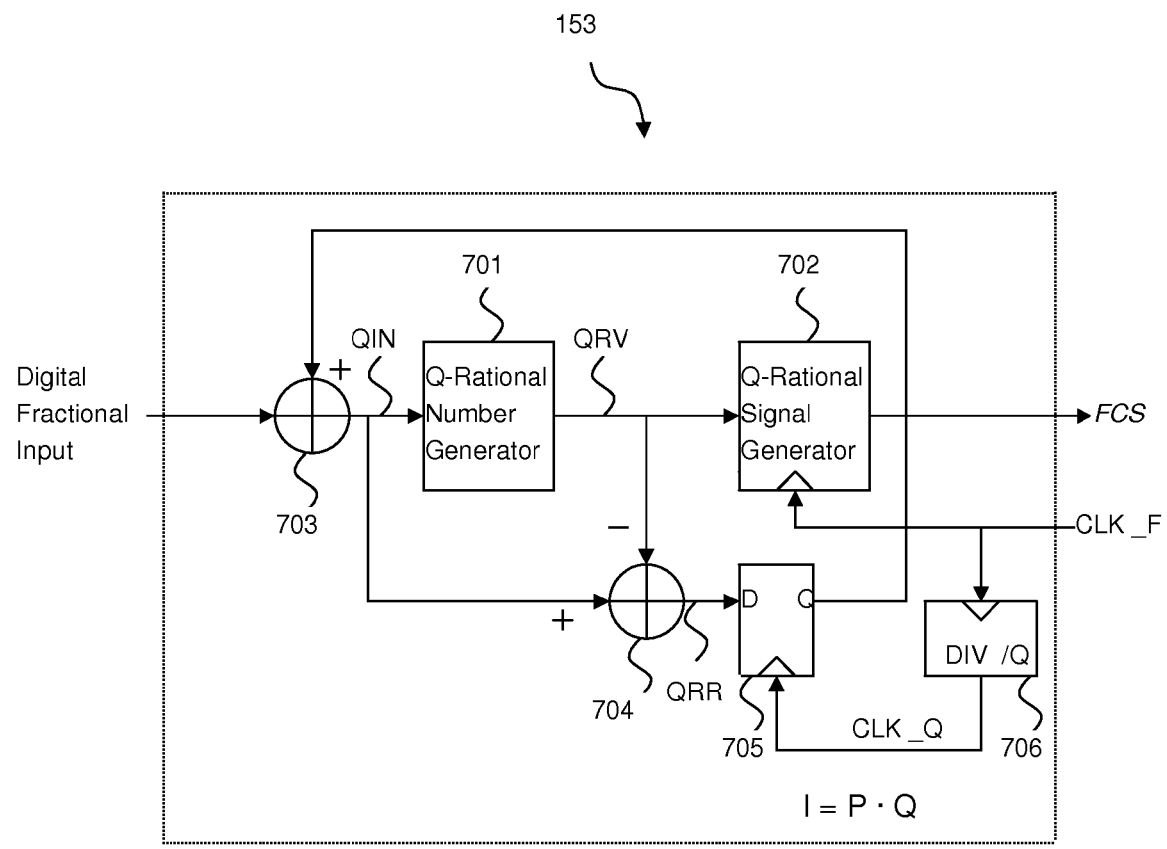
FIG. 7 schematically shows a fractional waveform generator in accordance with an embodiment of the present invention.
Figures 8A, 8B:
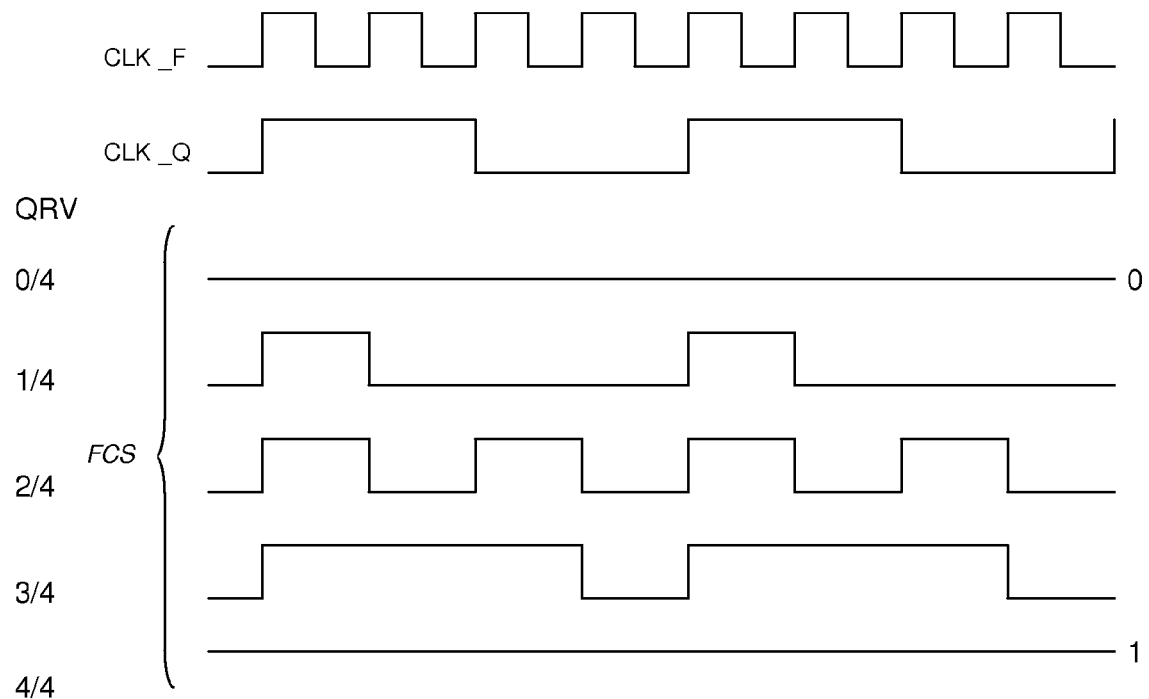
FIG. 8(a) shows a timing diagram of the fractional waveform generator in FIG. 7.
FIG. 8(b) shows a input and output mapping of a Q-rational number generator of the fractional waveform generator in FIG. 7.

In one embodiment, FIG. 7 schematically shows the fractional waveform generator 153 in accordance with an embodiment of the present invention. The fractional waveform generator 153 comprises a Q-rational number generator 701, a Q-rational signal generator 702, an adder 703, another adder 704, a group of sampling flip-flops 705, and a clock divider 706. The fractional waveform generator 153 is configured to receive the digital fractional input and the high-speed clock CLK_F and to generate the fractional control signal (FCS). The high-speed clock CLK_F is first divided by an integer of Q in the clock divider 706 to generate a clock CLK_Q. There are Q clock cycles of CLK_F in a clock cycle of CLK_Q. The fractional waveform generator can generate a total of Q+1 different waveforms over a clock cycle of CLK_Q. FIG. 8(a) shows a timing diagram of the generated waveforms in the case of Q=4. The Q-rational signal generator 702 generate the fractional control signal FCS in accordance with a value in net QRV. The values in the net QRV are restricted to a total of Q+1 different values. In the case of Q=4, the values in the net QRV are in the set of 0, 0.25, 0.5, 0.75, and 1. Due to the limited resolutions of the values in the net QRV, a residue in net QRR is calculated in the adder 704. The residue value in net QRR is added with the digital fractional input in the next clock cycle of CLK_Q to obtain a value in net QIN. The Q-rational number generator 701 receives the value in net QIN and generates the value in net QRV. In one embodiment, the Q-rational number generator 701 generates the values in QRV according to the table as shown in FIG. 8(b) in the case of Q=4.

A digitally controlled LC-tank oscillator has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. An apparatus for generating an output clock, comprising:
   a control logic circuit to receive the output clock, a fractional input, and an integer input, the control logic circuit comprising:
      a fractional waveform generator to generate a fractional control signal according to the output clock and the fractional input; and
      a controller to generate a plurality of control signals transmitted through word lines and bit lines to a dual bank of tuning cells according to the output clock and the integer input;
   a LC-tank comprising:
      an inductance with an inductance value and a capacitor with a first capacitance value;
      an integer tuning circuit comprising the dual bank of tuning cells, the dual bank is divided into a high bank and a low bank, the high bank and the low bank receiving the plurality of control signals from different word and bit lines to generate a second capacitance value collectively; and
      a fractional tuning circuit to receive the fractional control signal to generate a third capacitance value.

2. The apparatus of claim 1, wherein the integer tuning circuit further comprises a single bank of tuning cells.

3. The apparatus of claim 2, wherein at least one of the single bank of tuning cells and the dual bank of tuning cells comprises a two-dimensional array of tuning cells laid out in a matrix configuration.

4. The apparatus of claim 1, wherein the control logic circuit further comprises:
   a divider to divide the output clock to generate a first clock and a second clock, wherein the frequency of the first clock is higher than that of the second clock;
   wherein the fractional waveform generator generates the fractional control signal according to the first clock and the fractional input and the controller generates the plurality of control signals according to the second clock and the integer input.

5. The apparatus of claim 1, wherein each of the tuning cells comprises a memory circuit element and a tuning circuit element.

6. The apparatus of claim 1, wherein the fractional waveform generator comprises a Q-rational number generator, a Q-rational signal generator, a first adder, a second adder, a sampling circuit, and a clock divider.

7. The apparatus of claim 1, wherein at least some of the plurality of control signals are transmitted through complementary bit lines.

8. The apparatus of claim 1, wherein at most, two word lines can be asserted at a time, with one asserted word line from each bank.

9. A method for generating an output clock of a digitally controlled oscillator, comprising:
   receiving the output clock, a fractional input, and an integer input;
   generating a fractional control signal according to the output clock and the fractional input;
   generating a plurality of control signals according to the output clock and the integer input;
   providing a LC-tank which comprises a connection of an inductance with an inductance value and a capacitor with a first capacitance value;
   providing a second capacitance value according to the plurality of control signals transmitted through different word lines and different bit lines to a high bank and a low bank, the high bank and the low bank determining the second capacitance value collectively;
   providing a third capacitance value according to the fractional control signal; and
   outputting the output clock, wherein the oscillating frequency of the output clock corresponds to the inductance value, the first capacitance value, the second capacitance value, and the third capacitance value.

10. The method of claim 9, wherein the formula of the oscillating frequency is $$\frac{1}{(2\pi\sqrt{L_0(C_0 + C_1 + C_2 + C_3)})}.$$

11. The method of claim 9, wherein at least some of the plurality of control signals are transmitted through complementary bit lines.

12. The method of claim 9, wherein at most, two word lines can be asserted at a time, with one asserted word line from each bank.

13. An apparatus for generating an output clock, comprising:

a control logic circuit to receive the output clock, a fractional input, and an integer input, the control logic comprising:
- a fractional waveform generator to generate a fractional control signal according to the output clock and the fractional input; and
- a controller to generate a plurality of control signals according to the output clock and the integer input;

a LC-tank comprising:
- an inductance with an inductance value and a capacitor with a first capacitance value;
- an integer tuning circuit to receive the plurality of control signals to generate a second capacitance value; and
- a fractional tuning circuit to receive the fractional control signal to generate a third capacitance value, wherein the fractional waveform generator comprises a Q-rational number generator, a Q-rational signal generator, a first adder, a second adder, a sampling circuit, and a clock divider.

14. The apparatus of claim 13, wherein the integer tuning circuit comprises a single bank of tuning cells and a dual bank of tuning cells.

15. The apparatus of claim 14, wherein at least one of the single bank of tuning cells and the dual bank of tuning cells comprises a two-dimensional array of tuning cells laid out in a matrix configuration.

16. The apparatus of claim 13, wherein the control logic circuit further comprises:
- a divider to divide the output clock to generate a first clock and a second clock, wherein the frequency of the first clock is higher than that of the second clock;
- wherein the fractional waveform generator generates the fractional control signal according to the first clock and the fractional input and the controller generates the plurality of control signals according to the second clock and the integer input.

17. The apparatus of claim 13, wherein the integer tuning circuit further comprises a plurality of tuning cells, wherein each of the tuning cells comprises a memory circuit element and a tuning circuit element.

18. The apparatus of claim 13, wherein at least some of the plurality of control signals are transmitted through the word lines, the bit lines, and the complementary bit lines.

19. The apparatus of claim 13, wherein at most, two word lines can be asserted at a time, with one asserted word line from each bank.

* * * * *